United States Patent
McCandless et al.

(10) Patent No.: US 12,185,453 B2
(45) Date of Patent: Dec. 31, 2024

(54) RF ABSORBING STRUCTURES

(71) Applicant: Pivotal Commware, Inc., Kirkland, WA (US)

(72) Inventors: Jay Howard McCandless, Alpine, CA (US); Keone J. Holt, Duvall, WA (US); Larry Richard Bay, Cle Elum, WA (US); Anthony Jon Guenterberg, Puyallup, WA (US)

(73) Assignee: Pivotal Commware, Inc., Bothell, WA (US)

( * ) Notice: Subject to any disclaimer, the term of this patent is extended or adjusted under 35 U.S.C. 154(b) by 6 days.

(21) Appl. No.: 17/974,278

(22) Filed: Oct. 26, 2022

(65) Prior Publication Data
US 2023/0126395 A1 Apr. 27, 2023

Related U.S. Application Data

(60) Provisional application No. 63/272,007, filed on Oct. 26, 2021.

(51) Int. Cl.
*H05K 1/02* (2006.01)
*H05K 1/09* (2006.01)
*H05K 3/46* (2006.01)

(52) U.S. Cl.
CPC .......... *H05K 1/0234* (2013.01); *H05K 1/095* (2013.01); *H05K 3/4664* (2013.01)

(58) Field of Classification Search
CPC ....... H05K 1/0234; H05K 1/95; H05K 3/4664
See application file for complete search history.

(56) References Cited

U.S. PATENT DOCUMENTS

| | | | |
|---|---|---|---|
| 2,131,108 A | 9/1938 | Lindenblad |
| 4,464,663 A | 8/1984 | Lalezari et al. |
| 6,133,880 A | 10/2000 | Grangeat et al. |
| 6,150,987 A | 11/2000 | Sole et al. |
| 6,529,745 B1 | 3/2003 | Fukagawa et al. |
| 6,680,923 B1 | 1/2004 | Leon |
| 7,084,815 B2 | 8/2006 | Phillips et al. |
| 7,205,949 B2 | 4/2007 | Turner |
| 8,521,080 B2 | 8/2013 | Sakoda et al. |
| 8,711,989 B1 | 4/2014 | Lee et al. |
| 9,356,356 B2 | 5/2016 | Chang et al. |
| 9,385,435 B2 | 7/2016 | Bily et al. |

(Continued)

FOREIGN PATENT DOCUMENTS

| | | |
|---|---|---|
| AU | 2019239864 B2 | 9/2020 |
| AU | 2020226298 A1 | 2/2023 |

(Continued)

OTHER PUBLICATIONS

Office Communication for U.S. Appl. No. 15/925,612 mailed Jun. 15, 2018, pp. 1-9.

(Continued)

*Primary Examiner* — Jeremy C Norris
(74) *Attorney, Agent, or Firm* — John W. Branch; Branch Partners PLLC

(57) ABSTRACT

RF absorbing structures include a dielectric layer, such as polycarbonate, and one or more layers of a carbon resistive material, such as carbon ink. The RF absorbing structures can further include one or more layers of a conductive material, such as silver ink.

25 Claims, 5 Drawing Sheets

(56) References Cited

U.S. PATENT DOCUMENTS

| | | |
|---|---|---|
| 9,450,310 B2 | 9/2016 | Bily et al. |
| 9,551,785 B1 | 1/2017 | Geer |
| 9,608,314 B1 | 3/2017 | Kwon et al. |
| 9,635,456 B2 | 4/2017 | Fenichel |
| 9,711,852 B2 | 7/2017 | Chen et al. |
| 9,806,414 B2 | 10/2017 | Chen et al. |
| 9,806,415 B2 | 10/2017 | Chen et al. |
| 9,806,416 B2 | 10/2017 | Chen et al. |
| 9,812,779 B2 | 11/2017 | Chen et al. |
| 9,813,141 B1 | 11/2017 | Marupaduga et al. |
| 9,936,365 B1 | 4/2018 | Elam |
| 9,955,301 B2 | 4/2018 | Markhovsky et al. |
| 10,014,948 B2 | 7/2018 | Ashrafi |
| 10,020,891 B2 | 7/2018 | Ashrafi |
| 10,033,109 B1 | 7/2018 | Gummalla et al. |
| 10,153,845 B2 | 12/2018 | Ashrafi |
| 10,187,156 B2 | 1/2019 | Ashrafi |
| 10,225,760 B1 | 3/2019 | Black |
| 10,277,338 B2 | 4/2019 | Reial et al. |
| 10,313,894 B1 | 6/2019 | Desclos et al. |
| 10,324,158 B2 | 6/2019 | Wang et al. |
| 10,326,203 B1 | 6/2019 | Black et al. |
| 10,333,217 B1 | 6/2019 | Black et al. |
| 10,374,710 B2 | 8/2019 | Ashrafi |
| 10,425,905 B1 | 9/2019 | Black et al. |
| 10,431,899 B2 | 10/2019 | Bily et al. |
| 10,468,767 B1 | 11/2019 | McCandless et al. |
| 10,491,303 B2 | 11/2019 | Ashrafi |
| 10,505,620 B2 | 12/2019 | Ito et al. |
| 10,522,897 B1 | 12/2019 | Katko et al. |
| 10,524,154 B2 | 12/2019 | Black |
| 10,524,216 B1 | 12/2019 | Black et al. |
| 10,547,386 B2 | 1/2020 | Ashrafi |
| 10,594,033 B1 | 3/2020 | Black et al. |
| 10,673,646 B1 | 6/2020 | Shinar et al. |
| 10,734,736 B1 | 8/2020 | McCandless et al. |
| 10,862,545 B2 | 12/2020 | Deutsch et al. |
| 10,863,458 B2 | 12/2020 | Black et al. |
| 10,971,813 B2 | 4/2021 | McCandless et al. |
| 10,998,642 B1 | 5/2021 | McCandless et al. |
| 11,026,055 B1 | 6/2021 | Rea |
| 11,069,975 B1 | 7/2021 | Mason et al. |
| 11,088,433 B2 | 8/2021 | Katko et al. |
| 11,190,266 B1 | 11/2021 | Black et al. |
| 11,252,731 B1 | 2/2022 | Levitsky et al. |
| 11,279,480 B1 | 3/2022 | Rezvani |
| 11,297,606 B2 | 4/2022 | Machado et al. |
| 11,374,624 B2 | 6/2022 | Deutsch et al. |
| 11,424,815 B2 | 8/2022 | Black et al. |
| 11,431,382 B2 | 8/2022 | Deutsch et al. |
| 11,451,287 B1 | 9/2022 | Sivaprakasam et al. |
| 11,463,969 B2 | 10/2022 | Li et al. |
| 11,497,050 B2 | 11/2022 | Black et al. |
| 11,563,279 B2 | 1/2023 | McCandless et al. |
| 11,670,849 B2 | 6/2023 | Mason et al. |
| 11,706,722 B2 | 7/2023 | Black et al. |
| 11,757,180 B2 | 9/2023 | McCandless et al. |
| 11,843,955 B2 | 12/2023 | Cavcic et al. |
| 11,844,050 B2 | 12/2023 | Machado et al. |
| 11,848,478 B2 | 12/2023 | Katko et al. |
| 11,929,822 B2 | 3/2024 | Black |
| 11,937,199 B2 | 3/2024 | Katko et al. |
| 11,968,593 B2 | 4/2024 | Rea |
| 11,973,568 B2 | 4/2024 | Black et al. |
| 12,010,703 B2 | 6/2024 | Black et al. |
| 2001/0005406 A1 | 6/2001 | Mege et al. |
| 2002/0196185 A1 | 12/2002 | Bloy |
| 2003/0025638 A1 | 2/2003 | Apostolos |
| 2003/0062963 A1 | 4/2003 | Aikawa et al. |
| 2003/0151103 A1* | 8/2003 | Endo .................. G01L 1/20 257/414 |
| 2004/0003250 A1 | 1/2004 | Kindberg et al. |
| 2004/0038714 A1 | 2/2004 | Rhodes et al. |
| 2004/0229651 A1 | 11/2004 | Hulkkonen et al. |
| 2005/0237265 A1 | 10/2005 | Durham et al. |
| 2005/0282536 A1 | 12/2005 | McClure et al. |
| 2006/0025072 A1 | 2/2006 | Pan |
| 2007/0024514 A1 | 2/2007 | Phillips et al. |
| 2007/0147338 A1 | 6/2007 | Chandra et al. |
| 2007/0184828 A1 | 8/2007 | Majidi-Ahy |
| 2007/0202931 A1 | 8/2007 | Lee et al. |
| 2008/0039012 A1 | 2/2008 | McKay et al. |
| 2008/0049649 A1 | 2/2008 | Kozisek et al. |
| 2008/0181328 A1 | 7/2008 | Harel et al. |
| 2009/0153407 A1 | 6/2009 | Zhang et al. |
| 2009/0176487 A1 | 7/2009 | DeMarco |
| 2009/0207091 A1 | 8/2009 | Anagnostou et al. |
| 2009/0231215 A1 | 9/2009 | Taura |
| 2009/0296938 A1 | 12/2009 | Devanand et al. |
| 2010/0197222 A1 | 8/2010 | Scheucher |
| 2010/0207823 A1 | 8/2010 | Sakata et al. |
| 2010/0248659 A1 | 9/2010 | Kawabata |
| 2010/0302112 A1 | 12/2010 | Lindenmeier et al. |
| 2011/0070824 A1 | 3/2011 | Braithwaite |
| 2011/0199279 A1 | 8/2011 | Shen et al. |
| 2011/0292843 A1 | 12/2011 | Gan et al. |
| 2012/0064841 A1 | 3/2012 | Husted et al. |
| 2012/0094630 A1 | 4/2012 | Wisnewski et al. |
| 2012/0099856 A1 | 4/2012 | Britz et al. |
| 2012/0194399 A1 | 8/2012 | Bily et al. |
| 2013/0059620 A1 | 3/2013 | Cho |
| 2013/0069834 A1 | 3/2013 | Duerksen |
| 2013/0141190 A1 | 6/2013 | Kitaoka et al. |
| 2013/0171986 A1 | 7/2013 | Shimizu |
| 2013/0231066 A1 | 9/2013 | Zander et al. |
| 2013/0303145 A1 | 11/2013 | Harrang et al. |
| 2013/0324076 A1 | 12/2013 | Harrang |
| 2014/0073337 A1 | 3/2014 | Hong et al. |
| 2014/0094217 A1 | 4/2014 | Stafford |
| 2014/0171811 A1 | 6/2014 | Lin et al. |
| 2014/0198684 A1 | 7/2014 | Gravely et al. |
| 2014/0266946 A1 | 9/2014 | Bily et al. |
| 2014/0269417 A1 | 9/2014 | Yu et al. |
| 2014/0293904 A1 | 10/2014 | Dai et al. |
| 2014/0308962 A1 | 10/2014 | Zhang et al. |
| 2014/0349696 A1 | 11/2014 | Hyde et al. |
| 2015/0109178 A1 | 4/2015 | Hyde et al. |
| 2015/0109181 A1 | 4/2015 | Hyde et al. |
| 2015/0116153 A1 | 4/2015 | Chen et al. |
| 2015/0131618 A1 | 5/2015 | Chen |
| 2015/0162658 A1 | 6/2015 | Bowers et al. |
| 2015/0222021 A1 | 8/2015 | Stevenson et al. |
| 2015/0229028 A1 | 8/2015 | Bily et al. |
| 2015/0236777 A1 | 8/2015 | Akhtar et al. |
| 2015/0276926 A1 | 10/2015 | Bowers et al. |
| 2015/0276928 A1 | 10/2015 | Bowers et al. |
| 2015/0288063 A1 | 10/2015 | Johnson et al. |
| 2015/0318618 A1 | 11/2015 | Chen et al. |
| 2015/0372389 A1 | 12/2015 | Chen et al. |
| 2016/0037508 A1 | 2/2016 | Sun |
| 2016/0079672 A1 | 3/2016 | Cerreno |
| 2016/0087334 A1 | 3/2016 | Sayama et al. |
| 2016/0088648 A1 | 3/2016 | Xue et al. |
| 2016/0149308 A1 | 5/2016 | Chen et al. |
| 2016/0149309 A1 | 5/2016 | Chen et al. |
| 2016/0149310 A1 | 5/2016 | Chen et al. |
| 2016/0164175 A1 | 6/2016 | Chen et al. |
| 2016/0174241 A1 | 6/2016 | Ansari et al. |
| 2016/0198334 A1 | 7/2016 | Bakshi et al. |
| 2016/0219539 A1 | 7/2016 | Kim et al. |
| 2016/0241367 A1 | 8/2016 | Irmer et al. |
| 2016/0269964 A1 | 9/2016 | Murray |
| 2016/0302208 A1 | 10/2016 | Sturkovich et al. |
| 2016/0345221 A1 | 11/2016 | Axmon et al. |
| 2016/0365754 A1 | 12/2016 | Zeine et al. |
| 2016/0373181 A1 | 12/2016 | Black et al. |
| 2017/0033858 A1 | 2/2017 | Calcev et al. |
| 2017/0085357 A1 | 3/2017 | Shahar |
| 2017/0118750 A1 | 4/2017 | Kikuma et al. |
| 2017/0127295 A1 | 5/2017 | Black et al. |
| 2017/0127296 A1 | 5/2017 | Gustafsson et al. |
| 2017/0127332 A1 | 5/2017 | Axmon et al. |
| 2017/0142652 A1 | 5/2017 | Liu et al. |
| 2017/0155192 A1 | 6/2017 | Black et al. |

(56) References Cited

U.S. PATENT DOCUMENTS

| | | |
|---|---|---|
| 2017/0155193 A1 | 6/2017 | Black et al. |
| 2017/0187123 A1 | 6/2017 | Black et al. |
| 2017/0187426 A1 | 6/2017 | Su et al. |
| 2017/0194704 A1 | 7/2017 | Chawgo et al. |
| 2017/0195054 A1 | 7/2017 | Ashrafi |
| 2017/0238141 A1 | 8/2017 | Lindoff et al. |
| 2017/0310017 A1 | 10/2017 | Howard |
| 2017/0339575 A1 | 11/2017 | Kim et al. |
| 2017/0367053 A1 | 12/2017 | Noh et al. |
| 2017/0373403 A1 | 12/2017 | Watson |
| 2018/0013193 A1 | 1/2018 | Olsen et al. |
| 2018/0019798 A1 | 1/2018 | Khan et al. |
| 2018/0026683 A1 | 1/2018 | Manholm et al. |
| 2018/0027555 A1 | 1/2018 | Kim et al. |
| 2018/0066991 A1 | 3/2018 | Mueller et al. |
| 2018/0076521 A1 | 3/2018 | Mehdipour et al. |
| 2018/0097286 A1 | 4/2018 | Black et al. |
| 2018/0123692 A1 | 5/2018 | Leiba |
| 2018/0177461 A1 | 6/2018 | Bell et al. |
| 2018/0219283 A1 | 8/2018 | Wilkins et al. |
| 2018/0227035 A1 | 8/2018 | Cheng et al. |
| 2018/0227445 A1 | 8/2018 | Minegishi |
| 2018/0233821 A1 | 8/2018 | Pham et al. |
| 2018/0270729 A1 | 9/2018 | Ramachandra et al. |
| 2018/0301821 A1 | 10/2018 | Black et al. |
| 2018/0337445 A1 | 11/2018 | Sullivan et al. |
| 2018/0368389 A1 | 12/2018 | Adams |
| 2019/0020107 A1 | 1/2019 | Polehn et al. |
| 2019/0052428 A1 | 2/2019 | Chu et al. |
| 2019/0053013 A1 | 2/2019 | Markhovsky et al. |
| 2019/0067813 A1 | 2/2019 | Igura |
| 2019/0115972 A1 | 4/2019 | Braun et al. |
| 2019/0219982 A1 | 7/2019 | Klassen et al. |
| 2019/0221931 A1 | 7/2019 | Black et al. |
| 2019/0289482 A1 | 9/2019 | Black |
| 2019/0289560 A1 | 9/2019 | Black et al. |
| 2019/0336107 A1 | 11/2019 | Hope Simpson et al. |
| 2019/0372671 A1 | 12/2019 | Ashrafi |
| 2020/0008163 A1 | 1/2020 | Black et al. |
| 2020/0036413 A1 | 1/2020 | Deutsch et al. |
| 2020/0083605 A1 | 3/2020 | Quarfoth et al. |
| 2020/0083960 A1 | 3/2020 | Ashrafi |
| 2020/0091607 A1 | 3/2020 | Black et al. |
| 2020/0137698 A1 | 4/2020 | Black et al. |
| 2020/0186227 A1 | 6/2020 | Reider et al. |
| 2020/0205012 A1 | 6/2020 | Bengtsson et al. |
| 2020/0251802 A1 | 8/2020 | Katko et al. |
| 2020/0259552 A1 | 8/2020 | Ashworth |
| 2020/0266533 A1 | 8/2020 | McCandless et al. |
| 2020/0313741 A1 | 10/2020 | Zhu et al. |
| 2020/0366363 A1 | 11/2020 | Li et al. |
| 2020/0403689 A1 | 12/2020 | Rofougaran et al. |
| 2021/0036437 A1 | 2/2021 | Zhang et al. |
| 2021/0067237 A1 | 3/2021 | Sampath et al. |
| 2021/0159945 A1 | 5/2021 | Deutsch et al. |
| 2021/0167819 A1 | 6/2021 | Deutsch et al. |
| 2021/0176719 A1 | 6/2021 | Black et al. |
| 2021/0185623 A1 | 6/2021 | Black et al. |
| 2021/0234591 A1 | 7/2021 | Eleftheriadis et al. |
| 2021/0313677 A1 | 10/2021 | McCandless et al. |
| 2021/0328366 A1 | 10/2021 | McCandless et al. |
| 2021/0328664 A1 | 10/2021 | Schwab et al. |
| 2021/0367684 A1 | 11/2021 | Bendinelli et al. |
| 2021/0368355 A1 | 11/2021 | Liu et al. |
| 2021/0376912 A1 | 12/2021 | Black et al. |
| 2022/0014933 A1 | 1/2022 | Moon et al. |
| 2022/0038858 A1 | 2/2022 | Rea |
| 2022/0053433 A1 | 2/2022 | Abedini et al. |
| 2022/0078762 A1 | 3/2022 | Machado et al. |
| 2022/0085498 A1 | 3/2022 | Mason et al. |
| 2022/0085869 A1 | 3/2022 | Black et al. |
| 2022/0102828 A1 | 3/2022 | Katko et al. |
| 2022/0232396 A1 | 7/2022 | Cavcic et al. |
| 2022/0240305 A1 | 7/2022 | Black et al. |
| 2022/0302992 A1 | 9/2022 | Sivaprakasam et al. |
| 2022/0369295 A1 | 11/2022 | Machado et al. |
| 2023/0011531 A1 | 1/2023 | Black |
| 2023/0155666 A1 | 5/2023 | Black et al. |
| 2023/0164796 A1 | 5/2023 | Black et al. |
| 2023/0337162 A1 | 10/2023 | Katko et al. |
| 2024/0031953 A1 | 1/2024 | Black et al. |
| 2024/0039152 A1 | 2/2024 | Mason et al. |
| 2024/0222858 A1 | 7/2024 | McCandless et al. |
| 2024/0251256 A1 | 7/2024 | Cavcic et al. |
| 2024/0259831 A1 | 8/2024 | Cavcic et al. |
| 2024/0260006 A1 | 8/2024 | Machado et al. |

FOREIGN PATENT DOCUMENTS

| | | |
|---|---|---|
| CA | 3092509 A1 | 9/2019 |
| CN | 102948089 A | 2/2013 |
| CN | 103700951 A | 4/2014 |
| CN | 106572622 A | 4/2017 |
| CN | 106664124 A | 5/2017 |
| CN | 106797074 A | 5/2017 |
| CN | 109478900 A | 3/2019 |
| CN | 110034416 A | 7/2019 |
| CN | 110521277 A | 11/2019 |
| CN | 111903063 A | 11/2020 |
| EP | 3440778 A1 | 10/2017 |
| EP | 3273629 A1 | 1/2018 |
| EP | 3603329 A1 | 9/2018 |
| EP | 3769429 A1 | 9/2019 |
| EP | 3831115 A1 | 2/2020 |
| EP | 3928380 A1 | 8/2020 |
| EP | 3806345 A1 | 4/2021 |
| EP | 4085494 A1 | 7/2021 |
| EP | 4136759 A1 | 10/2021 |
| EP | 4158796 A1 | 12/2021 |
| EP | 4278645 A1 | 7/2022 |
| EP | 4285628 A1 | 8/2022 |
| EP | 3928380 B1 | 3/2024 |
| JP | S61-1102 A | 1/1986 |
| JP | H09-36656 A | 2/1997 |
| JP | H09-214418 A | 8/1997 |
| JP | 2000-111630 A | 4/2000 |
| JP | 3307146 B2 | 7/2002 |
| JP | 2003-110322 A | 4/2003 |
| JP | 2004-270143 A | 9/2004 |
| JP | 3600459 B2 | 12/2004 |
| JP | 2007-81648 A | 3/2007 |
| JP | 2007-306273 A | 11/2007 |
| JP | 2008-153798 A | 7/2008 |
| JP | 2009-514329 A | 4/2009 |
| JP | 2010-226457 A | 10/2010 |
| JP | 2011-507367 A | 3/2011 |
| JP | 2011-508994 A | 3/2011 |
| JP | 2012-175189 A | 9/2012 |
| JP | 2013-539949 A | 10/2013 |
| JP | 2014-075788 A | 4/2014 |
| JP | 2014-207626 A | 10/2014 |
| JP | 2014-531826 A | 11/2014 |
| JP | 2016-500214 A | 1/2016 |
| JP | 2016-139965 A | 8/2016 |
| JP | 2017-220825 A | 12/2017 |
| JP | 2018-14713 A | 1/2018 |
| JP | 2018-173921 A | 11/2018 |
| JP | 2019-518355 A | 6/2019 |
| JP | 2019-519956 A | 7/2019 |
| JP | 2020-515162 A | 5/2020 |
| JP | 2020-523863 A | 8/2020 |
| JP | 2020-145614 A | 9/2020 |
| JP | 2021-517406 A | 7/2021 |
| JP | 2021-532683 A | 11/2021 |
| JP | 2022-521286 A | 4/2022 |
| JP | 2023-519067 A | 5/2023 |
| JP | 2023-522640 A | 5/2023 |
| JP | 2023-527384 A | 6/2023 |
| JP | 7378414 B2 | 11/2023 |
| JP | 2024-504621 A | 2/2024 |
| JP | 2024-505881 A | 2/2024 |
| JP | 7451491 B2 | 3/2024 |
| JP | 7520861 B2 | 7/2024 |
| KR | 10-2004-0006000 A | 1/2004 |

(56) References Cited

FOREIGN PATENT DOCUMENTS

| | | |
|---|---|---|
| KR | 10-2005-0083901 A | 8/2005 |
| KR | 10-2006-0031895 A | 4/2006 |
| KR | 10-2006-0048953 A | 5/2006 |
| KR | 10-2008-0093257 A | 10/2008 |
| KR | 10-2012-0072144 A | 7/2012 |
| KR | 10-2013-0080008 A | 7/2013 |
| KR | 10-2016-0072062 A | 6/2016 |
| KR | 10 2016 0113100 A | 9/2016 |
| KR | 10-2019-0010545 A | 1/2019 |
| KR | 10-2019-0133194 A | 12/2019 |
| KR | 10-2020-0123254 A | 10/2020 |
| KR | 10-2021-0048499 A | 5/2021 |
| KR | 10-2021-0125579 A | 10/2021 |
| KR | 10-2022-0129570 A | 9/2022 |
| KR | 10-2023-0009895 A | 1/2023 |
| KR | 10-2023-0017280 A | 2/2023 |
| KR | 10-2023-0150811 A | 10/2023 |
| KR | 10-2640129 B1 | 2/2024 |
| TW | 202037208 A | 10/2020 |
| WO | 2007001134 A1 | 1/2007 |
| WO | 2009/075282 A1 | 6/2009 |
| WO | 2010104435 A1 | 9/2010 |
| WO | 2012050614 A1 | 4/2012 |
| WO | 2012096611 A2 | 7/2012 |
| WO | 2012161612 A1 | 11/2012 |
| WO | 2013023171 A1 | 2/2013 |
| WO | 2015196044 A1 | 12/2015 |
| WO | 2016044069 A1 | 3/2016 |
| WO | 2017008851 A1 | 1/2017 |
| WO | 2017014842 A1 | 1/2017 |
| WO | 2017/176746 A1 | 10/2017 |
| WO | 2017193056 A1 | 11/2017 |
| WO | 2018144940 A1 | 8/2018 |
| WO | 2018/175615 A1 | 9/2018 |
| WO | 2018179870 A1 | 10/2018 |
| WO | 2019/139745 A1 | 7/2019 |
| WO | 2019/183072 A1 | 9/2019 |
| WO | 2019/183107 A1 | 9/2019 |
| WO | 2020/027990 A1 | 2/2020 |
| WO | 2020/060705 A1 | 3/2020 |
| WO | 2020/076350 A1 | 4/2020 |
| WO | 2020095597 A1 | 5/2020 |
| WO | 2020/163052 A1 | 8/2020 |
| WO | 2020/171947 A1 | 8/2020 |
| WO | 2021003112 A1 | 1/2021 |
| WO | 2021/137898 A1 | 7/2021 |
| WO | 2021/211354 A1 | 10/2021 |
| WO | 2021/242996 A1 | 12/2021 |
| WO | 2022/031477 A1 | 2/2022 |
| WO | 2022/056024 A1 | 3/2022 |
| WO | 2022/155529 A1 | 7/2022 |
| WO | 2022/164930 A1 | 8/2022 |
| WO | 2023/283352 A1 | 1/2023 |
| WO | 2023/076405 A1 | 5/2023 |
| WO | 2023/205182 A1 | 10/2023 |
| WO | 2024/072997 A1 | 4/2024 |
| WO | 2024/108180 A1 | 5/2024 |

OTHER PUBLICATIONS

U.S. Appl. No. 14/510,947, filed Oct. 9, 2014, pp. 1-76.
Office Communication for U.S. Appl. No. 16/049,630 mailed Oct. 4, 2018, pp. 1-13.
Office Communication for U.S. Appl. No. 15/870,758 mailed Oct. 1, 2018, pp. 1-12.
Office Communication for U.S. Appl. No. 16/136,119 mailed Nov. 23, 2018, pp. 1-12.
Office Communication for U.S. Appl. No. 16/136,119 mailed Mar. 15, 2019, pp. 1-8.
Office Communication for U.S. Appl. No. 16/292,022 mailed Jun. 7, 2019, pp. 1-13.
Office Communication for U.S. Appl. No. 16/049,630 mailed Apr. 12, 2019, pp. 1-13.
Office Communication for U.S. Appl. No. 16/268,469 mailed May 16, 2019, pp. 1-16.
Office Communication for U.S. Appl. No. 16/280,939 mailed May 13, 2019, pp. 1-22.
Office Communication for U.S. Appl. No. 16/440,815 mailed Jul. 17, 2019, pp. 1-16.
Office Communication for U.S. Appl. No. 16/358,112 mailed May 15, 2019, pp. 1-17.
International Search Report and Written Opinion for International Patent Application No. PCT/US2019/022942 mailed Jul. 4, 2019, pp. 1-12.
Yurduseven, Okan et al., "Dual-Polarization Printed Holographic Multibeam Metasurface Antenna" Aug. 7, 2017, IEEE Antennas and Wireless Propagation Letters. pp. 10.1109/LAWP.2017, pp. 1-4.
International Search Report and Written Opinion for International Patent Application No. PCT/US2019/022987 mailed Jul. 2, 2019, pp. 1-13.
Office Communication for U.S. Appl. No. 16/049,630 mailed Jun. 24, 2019, pp. 1-5.
Office Communication for U.S. Appl. No. 16/280,939 mailed Jul. 18, 2019, pp. 1-7.
Office Communication for U.S. Appl. No. 16/049,630 mailed Aug. 7, 2019, pp. 1-13.
Office Communication for U.S. Appl. No. 16/292,022 mailed Sep. 23, 2019, pp. 1-9.
Office Communication for U.S. Appl. No. 16/440,815 mailed on Oct. 7, 2019, pp. 1-5.
Office Communication for U.S. Appl. No. 16/268,469 mailed Sep. 10, 2019, pp. 1-11.
International Search Report and Written Opinion for International Patent Application No. PCT/US2019/041053 mailed Aug. 27, 2019, pp. 1-8.
Office Communication for U.S. Appl. No. 16/568,096 mailed Oct. 24, 2019, pp. 1-10.
International Search Report and Written Opinion for International Patent Application No. PCT/US2019/047093 mailed Oct. 21, 2019, pp. 1-7.
Office Communication for U.S. Appl. No. 16/049,630 mailed Dec. 9, 2019, pp. 1-13.
Office Communication for U.S. Appl. No. 16/440,815 mailed Jan. 8, 2020, pp. 1-8.
Office Communication for U.S. Appl. No. 16/730,932 mailed Mar. 6, 2020, pp. 1-13.
Office Communication for U.S. Appl. No. 16/049,630 mailed Mar. 31, 2020, pp. 1-15.
Office Communication for U.S. Appl. No. 16/734,195 mailed Mar. 20, 2020, pp. 1-8.
Office Communication for U.S. Appl. No. 16/846,670 mailed Jun. 11, 2020, pp. 1-12.
Office Communication for U.S. Appl. No. 16/673,852 mailed Jun. 24, 2020, pp. 1-11.
International Search Report and Written Opinion for International Patent Application No. PCT/US2020/016641 mailed Apr. 14, 2020, pp. 1-7.
Gao, S.S. et al., "Holographic Artificial Impedance Surface Antenna Based on Circular Patch", 2018 International Conference on Microwave and Millimeter Wave Technology (ICMMT), 2018, pp. 1-3.
Nishiyama, Eisuke et al., "Polarization Controllable Microstrip Antenna using Beam Lead PIN Diodes", 2006 Asia-Pacific Microwave Conference, 2006, pp. 1-4.
International Search Report and Written Opinion for International Patent Application No. PCT/US2020/013713 mailed Apr. 21, 2020, pp. 1-8.
Office Communication for U.S. Appl. No. 16/049,630 mailed Aug. 19, 2020, pp. 1-18.
Office Communication for U.S. Appl. No. 16/730,932 mailed Aug. 25, 2020, pp. 1-5.
Office Communication for U.S. Appl. No. 16/983,927 mailed Aug. 31, 2020, pp. 1-7.
Office Communication for U.S. Appl. No. 16/983,978 mailed Sep. 16, 2020, pp. 1-7.
Office Communication for U.S. Appl. No. 16/049,630 mailed Oct. 15, 2020, pp. 1-16.

(56) References Cited

OTHER PUBLICATIONS

Office Communication for U.S. Appl. No. 16/983,978 mailed Oct. 27, 2020, pp. 1-13.
International Search Report and Written Opinion for International Patent Application No. PCT/US2020/048806 mailed Nov. 17, 2020, pp. 1-9.
Office Communication for U.S. Appl. No. 16/673,852 mailed Nov. 25, 2020, pp. 1-8.
Office Communication for U.S. Appl. No. 16/846,670 mailed Nov. 25, 2020, pp. 1-13.
Office Communication for U.S. Appl. No. 16/983,927 mailed Jan. 6, 2021, pp. 1-8.
Office Communication for U.S. Appl. No. 16/846,670 mailed Feb. 8, 2021, pp. 1-4.
Office Communication for U.S. Appl. No. 16/983,978 mailed Feb. 10, 2021, pp. 1-11.
Office Communication for U.S. Appl. No. 16/846,670 mailed Apr. 2, 2021, pp. 1-9.
Office Communication for U.S. Appl. No. 16/730,690 mailed Apr. 8, 2021, pp. 1-11.
Office Communication for U.S. Appl. No. 17/177,131 mailed Apr. 9, 2021, pp. 1-17.
Vu, Trung Kien et al., "Joint Load Balancing and Interference Mitigation in 5G Heterogeneous Networks," IEEE Transactions on Wireless Communications, 2017, vol. 16, No. 9, pp. 6032-6046.
Office Communication for U.S. Appl. No. 17/177,145 mailed Apr. 19, 2021, pp. 1-11.
Office Communication for U.S. Appl. No. 17/112,940 mailed Jul. 21, 2021, pp. 1-22.
International Search Report and Written Opinion for International Patent Application No. PCT/US2021/026400 mailed Jul. 20, 2021, pp. 1-7.
Office Communication for U.S. Appl. No. 17/177,145 mailed Aug. 3, 2021, pp. 1-16.
Office Communication for U.S. Appl. No. 17/177,131 mailed Aug. 6, 2021, pp. 1-16.
Office Communication for U.S. Appl. No. 17/112,940 mailed Aug. 9, 2021, pp. 1-20.
International Search Report and Written Opinion for International Patent Application No. PCT/US2021/034479 mailed Aug. 10, 2021, pp. 1-7.
Office Communication for U.S. Appl. No. 17/332,136 mailed Sep. 2, 2021, pp. 1-9.
Office Communication for Chinese Patent Application No. 201980019925.1 mailed Sep. 27, 2021, pp. 1-25.
Office Communication for U.S. Appl. No. 17/177,145 mailed Oct. 14, 2021, pp. 1-5.
International Search Report and Written Opinion for International Patent Application No. PCT/US2021/043308 mailed Nov. 2, 2021, pp. 1-8.
Office Communication for U.S. Appl. No. 17/177,131 mailed Nov. 12, 2021, pp. 1-5.
Extended European Search Report for European Patent Application No. 19772471.9 mailed Nov. 8, 2021, pp. 1-8.
Office Communication for U.S. Appl. No. 17/177,145 mailed Nov. 16, 2021, pp. 1-16.
Office Communication for U.S. Appl. No. 17/177,131 mailed Dec. 17, 2021, pp. 1-14.
Black, Eric J., "Holographic Beam Forming and MIMO," Pivotal Commware, 2017, pp. 1-8.
Björn, Ekman, "Machine Learning for Beam Based Mobility Optimization in NR," Master of Science Thesis in Communication Systems, Department of Electrical Engineering, Linköping University, 2017, pp. 1-85.
Office Communication for U.S. Appl. No. 17/112,940 mailed Dec. 22, 2021, pp. 1-15.
International Search Report and Written Opinion for International Patent Application No. PCT/US2021/049502 mailed Dec. 14, 2021, pp. 1-8.
Office Communication for U.S. Appl. No. 17/469,694 mailed Jan. 20, 2022, pp. 1-9.
Office Communication for U.S. Appl. No. 17/537,233 mailed Feb. 4, 2022, pp. 1-9.
Office Communication for U.S. Appl. No. 17/112,940 mailed Mar. 17, 2022, pp. 1-16.
Office Communication for U.S. Appl. No. 17/576,832 mailed Mar. 18, 2022, pp. 1-15.
Office Communication for U.S. Appl. No. 17/177,145 mailed Mar. 24, 2022, pp. 1-18.
Office Communication for U.S. Appl. No. 17/306,361 mailed Mar. 28, 2022, pp. 1-7.
Extended European Search Report for European Patent Application No. 19844867.2 mailed Mar. 30, 2022, pp. 1-16.
Office Communication for U.S. Appl. No. 17/576,832 mailed Apr. 1, 2022, pp. 1-14.
Office Communication for U.S. Appl. No. 17/585,418 mailed Apr. 8, 2022, pp. 1-9.
Office Communication for U.S. Appl. No. 17/537,233 mailed Apr. 20, 2022, pp. 1-9.
Office Communication for U.S. Appl. No. 17/203,255 mailed Apr. 26, 2022, pp. 1-17.
Office Communication for U.S. Appl. No. 17/177,131 mailed Apr. 27, 2022, pp. 1-14.
International Search Report and Written Opinion for International Patent Application No. PCT/US2022/012613 mailed May 10, 2022, pp. 1-8.
International Search Report and Written Opinion for International Patent Application No. PCT/US2022/013942 mailed May 10, 2022, pp. 1-8.
Qualcomm Incorporated, "Common understanding of repeaters," 3GPP TSG RAN WG4 #98_e R4-2102829, 2021, https://www.3gpp.org/ftp/tsg_ran/WG4_Radio/TSGR4_98_e/Docs/R4-2102829.zip, Accessed: May 25, 2022, pp. 1-2.
MediaTek Inc., "General views on NR repeater," 3GPP TSG RAN WG4 #98_e R4-2101156, 2021, https://www.3gpp.org/ftp/tsg_ran/WG4_Radio/TSGR4_98_e/Docs/R4-2101156.zip, Accessed: May 25, 2022, pp. 1-4.
Office Communication for U.S. Appl. No. 17/177,145 mailed Jun. 3, 2022, pp. 1-5.
Office Communication for U.S. Appl. No. 17/576,832 mailed Jul. 13, 2022, pp. 1-15.
Office Communication for U.S. Appl. No. 17/585,418 mailed Jul. 22, 2022, pp. 1-6.
Office Communication for U.S. Appl. No. 17/585,418 mailed Aug. 4, 2022, pp. 1-2.
Office Communication for U.S. Appl. No. 17/306,361 mailed Sep. 9, 2022, pp. 1-7.
Office Communication for U.S. Appl. No. 17/576,832 mailed Sep. 23, 2022, pp. 1-5.
Office Communication for U.S. Appl. No. 17/306,361 mailed Sep. 27, 2022, pp. 1-7.
Office Communication for U.S. Appl. No. 17/379,813 mailed Oct. 5, 2022, pp. 1-11.
Office Communication for U.S. Appl. No. 17/217,882 mailed Oct. 13, 2022, pp. 1-14.
Office Communication for U.S. Appl. No. 17/397,442 mailed Oct. 27, 2022, pp. 1-8.
Office Communication for U.S. Appl. No. 17/859,632 mailed Oct. 27, 2022, pp. 1-12.
International Search Report and Written Opinion for International Patent Application No. PCT/US2022/036381 mailed Oct. 25, 2022, pp. 1-8.
Extended European Search Report for European Patent Application No. 20759272.6 mailed Nov. 3, 2022, pp. 1-9.
Office Communication for U.S. Appl. No. 17/980,391 mailed Jul. 3, 2023, pp. 1-9.
Office Communication for Japanese Patent Application No. JP 2020-548724 mailed Jun. 15, 2023, pp. 1-5.
International Search Report and Written Opinion for International Patent Application No. PCT/US2023/018993 mailed Jun. 27, 2023, pp. 1-9.

(56) References Cited

OTHER PUBLICATIONS

Office Communication for U.S. Appl. No. 17/576,832 mailed Jul. 13, 2023, pp. 1-4.
Office Communication for U.S. Appl. No. 18/136,238 mailed Jul. 20, 2023, pp. 1-8.
Examination Report for European Patent Application No. 19772471.9 mailed Jul. 28, 2023, pp. 1-4.
Office Communication for Korean Patent Application No. KR 10-2020-7029161 mailed Jul. 19, 2023, pp. 1-15.
Office Communication for U.S. Appl. No. 17/708,757 mailed Aug. 4, 2023, pp. 1-8.
Office Communication for U.S. Appl. No. 17/859,632 mailed Aug. 8, 2023, pp. 1-14.
Office Communication for U.S. Appl. No. 17/334,105 mailed Aug. 11, 2023, pp. 1-16.
Office Communication for U.S. Appl. No. 17/576,832 mailed Aug. 16, 2023, pp. 1-7.
Office Communication for U.S. Appl. No. 17/576,832 mailed Aug. 24, 2023, pp. 1-4.
Office Communication for U.S. Appl. No. 17/576,832 mailed Apr. 28, 2023, pp. 1-15.
Office Communication for U.S. Appl. No. 17/217,882 mailed May 15, 2023, pp. 1-6.
Office Communication for U.S. Appl. No. 17/859,632 mailed May 16, 2023, pp. 1-4.
Office Communication for Japanese Patent Application No. JP 2021-505304 mailed May 9, 2023, pp. 1-6.
Office Communication for U.S. Appl. No. 17/891,970 mailed Jun. 16, 2023, pp. 1-11.
Communication for U.S. Appl. No. 17/397,442 mailed Jun. 23, 2023, pp. 1-15.
Office Communication for U.S. Appl. No. 17/891,970 mailed Feb. 12, 2024, pp. 1-8.
Decision to Grant for Japanese Patent Application No. JP 2021-505304 mailed Feb. 5, 2024, 06 Pages including English translation.
International Search Report and Written Opinion for International Patent Application No. PCT/US2023/080392 mailed Feb. 27, 2024, 15 Pages.
Office Communication for U.S. Appl. No. 17/980,391 mailed Apr. 12, 2024, 5 Pages.
Extended European Search report for European Patent Application No. EP 21788290.1 mailed Mar. 28, 2024, 9 pages.
Office Communication for European Patent Application No. 19844867.2 mailed Apr. 16, 2024, 8 Pages.
International Preliminary Report on Patentability Chapter I for International Patent Application No. PCT/US2022/047909 mailed May 10, 2024, 5 Pages.
Office Communication for European Patent Application No. EP 19772471.9 mailed May 31, 2024, 9 pages.
Extended European Search report for European Patent Application No. EP 21814490.5 mailed May 28, 2024, 12 pages.
"3rd Generation Partnership Project; Technical Specification Group Services and System Aspects; 3GPP System Architecture Evolution (SAE); Security architecture (Release 15)" 3GPP TS 33.401, V15.11.0, Release 11, Mar. 27, 2020 pp. 1-163.
Gemalto et al., "Background of Relay Node Security Solution", 3rd Generation Partnership Project (3GPP), Feb. 22-25, 2011, pp. 1-13.
Office Communication for Japan Patent Application No. JP 2021-549237 mailed Jun. 11, 2024, 5 pages including English Translation.
"Automatic Cell Planning (ACP)", Forsk, Retrieved on Jul. 18, 2024, Webpage available at: <https://www.forsk.com/ automatic-cell-planning-acp> 7 pages.
"NVIDIA Unveils 6G Research Cloud Platform to Advance Wireless Communications With AI", NVIDIA, Retrieved on Mar. 18, 2024, Available at <https://nvidianews.nvidia.com/news/nvidia-unveils-6g-research-cloud-platform-to-advance-wireless-communications-with-ai>, 2 pages.
Julien Berranger, "SIRADEL releases Bloonet its innovative solution for RAN design automation", SIRADEL, Retrieved on Oct. 21, 2021, Webpage available at: https://www.siradel.com/siradel-releases-bloonet-its-innovative-solution-for-ran-design-automation/, 6 pages.
"Mapbox Unveils Digital Twin in Partnership with Snowflake and Maxar to Revolutionize Telecom Visualization", Mapbox, Retrieved on Feb. 26, 2024, Webpage available at: https://www.mapbox.com/press-releases/mapbox-unveils-digital-twin-in-partnership-with-snowflake-and-maxar-to-revolutionize-telecom-visualization, 7 pages.
Monica Wamsley, "Blare Tech Builds 5G Network Planning Tools with CesiumJS", Cesium, Retrieved on Jan. 30, 2024, Webpage available at: https://cesium.com/blog/2024/01/30/blare-tech-builds-5g-network-planning-tools-with-cesiumjs/, 6 pages.
"Bridging the Gap Between Indoor and Outdoor Wireless", iBwave Reach, iBwave Solutions Inc., 1994-2020, 5 pages.
Terragraph Mesh, Retrieved on Jul. 18, 2024, Webpage Available at: <https://terragraph.com/assets/files/Terragraph_Mesh_Whitepaper-d906f1eb9c3ea7a8c1bbd8552b1f9f2d.pdf>, 11 pages.
"Canny edge detector", Scikit-image, Retrieved on Jul. 18, 2024, Webpage available at: <https://scikit-image.org/docs/stable/auto_examples/edges/plot_canny.html#sphx-glr-auto-examples-edges-plot-canny-py>, 2 pages.
"5G Fixed Wireless Access: Can FWA meet our cities needs?", Digital Twin Sim, Retrieved on Jul. 18, 2024, Webpage Available at: https://www.digitaltwinsim.com/fwa_modeling, 07 pages.
ETSI, "5G; Study on channel model for frequencies from 0.5 to 100 GHz (3GPP TR 38.901 version 17.1.0 Release 17)", ETSI TR 138 901, version 17.1.0, Release 17, Jan. 2024, 99 pages.
Office Communication for U.S. Appl. No. 18/530,034 mailed Jul. 15, 2024, pp. 1-7.
Office Communication for Japanese Patent Application No. JP 2020-548724 mailed Mar. 8, 2023, pp. 1-9.
Shimura, Tatsuhiro et al., "A study of indoor area expansion by quasi-millimeter wave repeater," The Collection of Lecture Articles of the 2018 IEICE General Conference, Mar. 2018, pp. 1-5.
Office Communication for U.S. Appl. No. 17/334,105 mailed Nov. 30, 2022, pp. 1-7.
Office Communication for U.S. Appl. No. 17/576,832 mailed Dec. 15, 2022, pp. 1-15.
Falconer, David D. et al., "Coverage Enhancement Methods for LMDS," IEEE Communications Magazine, Jul. 2003, vol. 41, Iss. 7, pp. 86-92.
Office Communication for U.S. Appl. No. 17/708,757 mailed Jan. 20, 2023, pp. 1-5.
Office Communication for U.S. Appl. No. 17/379,813 mailed Feb. 3, 2023, pp. 1-10.
Office Communication for U.S. Appl. No. 17/112,895 mailed Feb. 6, 2023, pp. 1-8.
Office Communication for U.S. Appl. No. 17/379,813 mailed Feb. 15, 2023, pp. 1-3.
Office Communication for U.S. Appl. No. 17/859,632 mailed Feb. 28, 2023, pp. 1-13.
International Search Report and Written Opinion for International Patent Application No. PCT/US2022/047909 mailed Feb. 21, 2023, pp. 1-7.
Cheng et al., "Real-time two-dimensional beam steering with gate-tunable materials: a theoretical investigation", Applied Optics, vol. 55, No. 22, Aug. 1, 2016, pp. 6137-6144.
Wolf et al., "Phased-Array Sources Based on Nonlinear Metamaterial Nanocavities", Nature Communications, vol. 6, 7667, 2015 Macmillan Publishers Limited, pp. 1-6.
Examination Report No. 1 for Australian Patent Application No. 2019239864, mailed Jul. 7, 2022, pp. 1-3.
Intention to Grant for European Patent Application No. 20759272.6 mailed Sep. 19, 2023, 11 pages.
International Preliminary Report on Patentability Chapter 1 for International Patent Application No. PCT/US2018/066329 mailed Jul. 23, 2020, pp. 1-7.
International Preliminary Report on Patentability Chapter I for International Patent Application No. PCT/US2019/022987 mailed Oct. 1, 2020, pp. 1-9.
International Preliminary Report on Patentability Chapter I for International Patent Application No. PCT/US2019/041053 mailed Feb. 11, 2021, pp. 1-6.

(56) References Cited

OTHER PUBLICATIONS

International Preliminary Report on Patentability Chapter I for International Patent Application No. PCT/US2019/047093 mailed Apr. 1, 2021, pp. 1-5.
International Preliminary Report on Patentability Chapter I for International Patent Application No. PCT/US2020/013713 mailed Aug. 19, 2021, pp. 1-6.
International Preliminary Report on Patentability Chapter I for International Patent Application No. PCT/US2020/016641 mailed Sep. 2, 2021, pp. 1-5.
International Preliminary Report on Patentability Chapter I for International Patent Application No. PCT/US2020/048806 mailed Jul. 14, 2022, pp. 1-7.
International Preliminary Report on Patentability Chapter I for International Patent Application No. PCT/US2021/034479 mailed Dec. 8, 2022, pp. 1-5.
International Preliminary Report on Patentability Chapter I for International Patent Application No. PCT/US2021/043308 mailed Feb. 16, 2023, pp. 1-6.
International Preliminary Report on Patentability Chapter I for International Patent Application No. PCT/US2021/049502 mailed Mar. 23, 2023, pp. 1-6.
International Preliminary Report on Patentability Chapter I for International Patent Application No. PCT/US2022/012613 mailed Jul. 27, 2023, pp. 1-6.
International Preliminary Report on Patentability Chapter I for International Patent Application No. PCT/US2022/013942 mailed Aug. 10, 2023, pp. 1-6.
International Preliminary Report on Patentability Chapter I for International Patent Application No. PCT/US2021/026400 mailed Oct. 27, 2022, pp. 1-5.
International Preliminary Report on Patentability for International Patent Application No. PCT/US2019/022942 mailed Oct. 1, 2020, pp. 1-8.
International Search Report and Written Opinion for International Patent Application No. PCT/US2018/066329 mailed May 31, 2019, pp. 1-8.
Notice of Acceptance for Australian Patent Application No. 2019239864 mailed Jan. 16, 2023, pp. 1-3.
Office Communication for U.S. Appl. No. 15/870,758 mailed Apr. 16, 2019, pp. 1-10.
Office Communication for U.S. Appl. No. 15/925,612 mailed Dec. 19, 2018, pp. 1-12.
Office Communication for U.S. Appl. No. 16/049,630 mailed Feb. 18, 2020, pp. 1-5.
Office Communication for U.S. Appl. No. 16/730,690 mailed Apr. 21, 2021, pp. 1-2.
Office Communication for U.S. Appl. No. 16/846,670 mailed Apr. 21, 2021, pp. 1-2.
Office Communication for U.S. Appl. No. 17/203,255 mailed May 5, 2022, pp. 1-2.
Office Communication for U.S. Appl. No. 17/397,442 mailed Sep. 8, 2023, pp. 1-16.
Office Communication for U.S. Appl. No. 17/891,970 mailed Sep. 25, 2023, pp. 1-8.
Search Report for Chinese Patent Application No. 201980019925.1 mailed on Sep. 19, 2021, pp. 1-2.
U.S. Appl. No. 62/743,672, filed Oct. 10, 2018, pp. 1-278.

Extended European Search report for European Patent Application No. EP 20908525.7 mailed Jan. 3, 2024, 11 pages.
Nawaz et al., "Double-Differential-Fed, Dual-Polarized Patch Antenna With 90 dB Interport RF Isolation for a 2.4 GHZ In-Band FullDuplex Transceiver", IEEE Antennas and Wireless Propagation Letters, vol. 17, No. 2, Feb. 2018, pp. 287-290.
International Search Report and Written Opinion for International Patent Application No. PCT/US2023/034033 mailed Dec. 12, 2023, 13 Pages.
International Preliminary Report on Patentability Chapter I for International Patent Application No. PCT/ US2022/036381 mailed Jan. 18, 2024, 6 Pages.
Office Communication for Korean Patent Application No. 10-2021-7029953 mailed Jan. 2, 2024, 8 Pages including English translation.
Office Communication for Korean Patent Application No. KR 10-2021-7006085 mailed Aug. 20, 2024, 11 pages including English Translation.
Pandi et al., "Antenna beam forming using holographic artificial impedance surface", IEEE, Jul. 17, 2014, 16th International Symposium on ANTEM, pp. 1-2.
Examination Report No. 1 for Australian Patent Application No. 2020226298, mailed Aug. 27, 2024, pp. 1-2.
Office Communication for Korean Patent Application No. KR 10-2021-7029953 mailed Sep. 2, 2024, 5 pages including English Translation.
Office Communication for Korean Patent Application No. KR 10-2022-7026864 mailed Aug. 26, 2024, 13 pages including English Translation.
Office Communication for Japan Patent Application No. JP 2022-562458 mailed Sep. 5, 2024, 8 pages including English Translation.
Office Communication for U.S. Appl. No. 18/244,541 mailed Aug. 14, 2024, pp. 1-15.
Office Communication for U.S. Appl. No. 17/334,105 mailed Oct. 25, 2023, pp. 4.
Office Communication for U.S. Appl. No. 18/136,238 mailed Oct. 25, 2023, pp. 1-9.
Office Communication for U.S. Appl. No. 17/334,105 mailed Nov. 8, 2023, pp. 1-13.
Office Communication for U.S. Appl. No. 17/334,105 mailed Nov. 16, 2023, pp. 2.
Office Action for Japanese Patent Application No. JP 2021-505304 mailed Oct. 26, 2023, 06 Pages including English translation.
Office Action for Japanese Patent Application No. JP 2021-549237 mailed Oct. 16, 2023, 06 Pages including English translation.
Office Communication for U.S. Appl. No. 18/205,433 mailed Dec. 12, 2023, 17 Pages.
Office Communication for U.S. Appl. No. 17/980,391 mailed Nov. 21, 2023, 10 Pages.
Office Communication for U.S. Appl. No. 17/859,632 mailed Dec. 18, 2023, 10 Pages.
Office Communication for Korean Patent Application No. 10-2020-7029161 mailed Dec. 11, 2023, 6 Pages including English translation.
Office Communication for Japanese Patent Application No. JP 2020-548724 mailed Oct. 2, 2023, 05 Pages including English translation.

* cited by examiner

RF ABSORBING STRUCTURES

CROSS-REFERENCE TO RELATED APPLICATION

This application is a Utility patent application based on previously filed U.S. Provisional Patent Application No. 63/272,007, filed on Oct. 26, 2021, entitled "RF ABSORBING STRUCTURES" and naming Jay Howard McCandless et al. as inventors, the benefit of the filing date of which is hereby claimed under 35 U.S.C. § 119(e) and the contents of which is further incorporated in entirety by reference.

TECHNICAL FIELD

The invention relates to structures for radio frequency (RF) absorption with films of resistive carbon and/or conductive silver applied to dielectric substrates, methods of manufacturing these RF absorption structures, and RF apparatuses that include these RF absorption structures.

BACKGROUND

RF absorptive structures are desirable in many RF applications, including millimeter wave (mmW) applications, to improve the performance of RF apertures and RF cavities. For example, RF apertures may need to be surrounded by or lined with RF absorptive structures to improve the radiation patterns of the RF apertures and/or to prevent surface waves from propagating along structural features adjacent to the RF apertures. For an apparatus such as an RF repeater that includes an RF transmit aperture within proximity to an RF receive aperture, RF absorptive structures may be arranged between the RF transmit aperture and the RF receive aperture to increase isolation between the proximate apertures.

As another example, RF cavities may need to have enclosures that include RF absorptive structures to prevent RF energy from escaping the cavities. For a cavity that is provided by mating two or more conducting structures together, e.g., joining a ground plane to a metal plate that has been milled or molded to include a recessed cavity volume, RF absorptive structures can be included in the gasket between the mated conducting structures to prevent RF energy from escaping through the joint between the mated conducting structures.

Existing RF absorbing materials such as CUMING MICROWAVE C-RAM MT and WAVEXORB are cost-prohibitive for some applications. Further, existing RF absorbing materials may be too bulky for some applications, or not sufficiently absorptive at frequencies or polarizations of interest for certain applications.

DESCRIPTION OF VARIOUS EMBODIMENTS OF THE INVENTION

Figure 1:
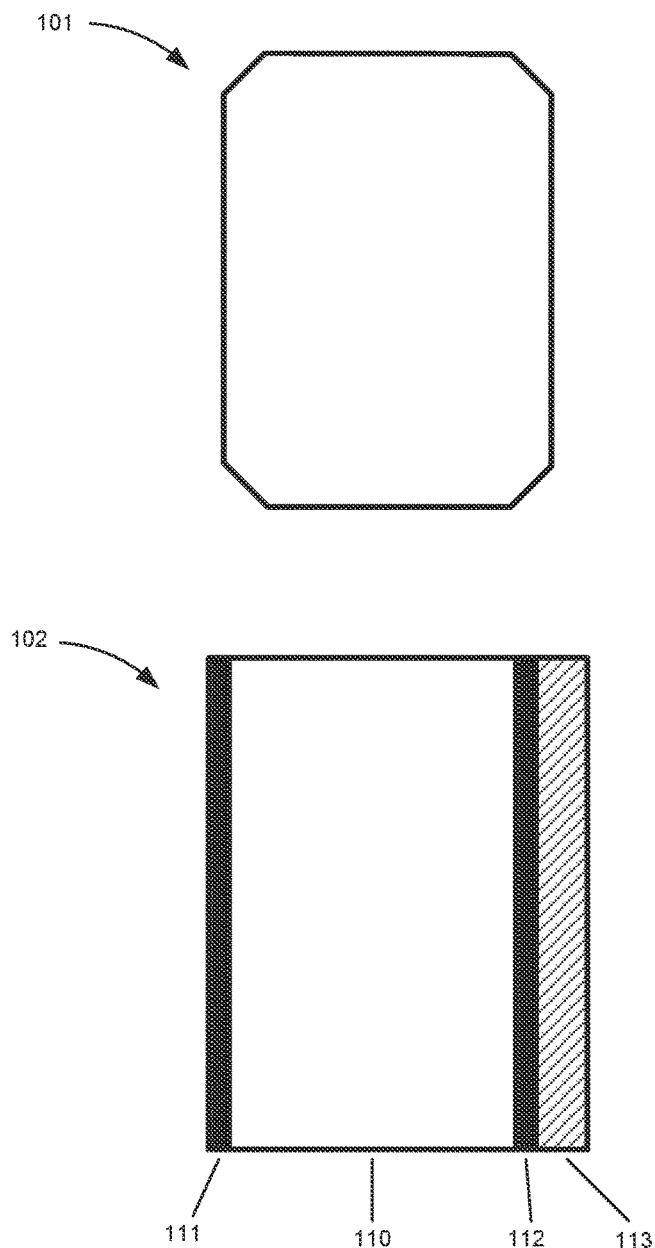
FIG. 1 depicts an example of a carbon/polycarbonate/carbon/pressure-sensitive-adhesive (PSA) laminate.

The present invention now will be described more fully hereinafter with reference to the accompanying drawings, which form a part hereof, and which show, by way of illustration, specific embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment, an entirely software embodiment or an embodiment combining software and hardware aspects. The following detailed description is, therefore, not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. Similarly, the phrase "in another embodiment" as used herein does not necessarily refer to a different embodiment, though it may. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

In some approaches the invention provides a low-cost laminate material with RF absorbing properties. The core laminate can be, for example, a polycarbonate sheet that is coated with electrically conductive carbon ink on one or both sides. A Pressure Sensitive Adhesive (PSA) can be applied to one side of the sheet for installation or lamination purposes.

The core laminate can be used as a single layer by, for example, cutting the material to the needed shape and adhering it to the surface of the product where RF absorption is required. In other applications two or more layers can be laminated together to achieve the desired RF performance.

Some approaches provide an RF absorbing structure that includes a first dielectric layer of a dielectric material; and a first upper film of a resistive carbon material disposed on an upper surface of the first dielectric layer. In some approaches, the resistive carbon material can be patterned, e.g., as zigzags, lines, circles, line segments, or the like, with a feature size that is substantially less than a free-space wavelength corresponding to an intended frequency range for the RF absorptive properties of the structure. The first upper film may also include a conductive material such as copper, silver, or gold ink, and that conductive material can also be similarly patterned, with the pattern of the resistive carbon material being interleaved or interspersed with the pattern of the conductive material. The patterning of the resistive carbon material and/or the conductive material can be selected to increase an impedance match between the RF absorbing structure and free space for the intended frequency range, to better admit RF energy into the structure for absorption and attenuation.

The RF absorbing structure can optionally include a first lower film of the resistive carbon material disposed on a lower surface of the first dielectric layer. In some approaches, the resistive carbon material can be patterned, e.g., as zigzags, lines, circles, line segments, or the like, with a feature size that is substantially less than a free-space wavelength corresponding to an intended frequency range for the RF absorptive properties of the structure. The first lower film may also include a conductive material such as copper, silver, or gold ink, and that conductive material can also be similarly patterned, with the pattern of the resistive carbon material being interleaved or interspersed with the pattern of the conductive material. The patterning of the resistive carbon material and/or the conductive material can be selected to increase an impedance match between the RF absorbing structure and free space for the intended frequency range, to better admit RF energy into the structure for absorption and attenuation. For approaches that included patterned films on both the upper and lower surfaces of the dielectric layer, the patterns on the upper or lower surfaces can be offset or rotated relative to each other (e.g., rotated 90 degrees relative to each other) to improve the free space impedance match and/or RF absorptive properties of the structure.

In some approaches, the dielectric material is a sheet-formed material or a rollable material. The dielectric material can be a low-dielectric constant material, e.g., having a dielectric constant less than about 1.5, or less than about 2.0, or less than about 3.0 The dielectric material can be a plastic material, such as polycarbonate, polyethylene, polyester, silicone, or RF prepreg. The dielectric material can be a ceramic or composite material. The dielectric layer can have a thickness of, for example, about 5, 10, or 20 mils, depending on the desired range of operating wavelengths for the RF application.

The resistive carbon material can be a carbon ink or paint, or a carbon film material, or a carbon paper or fabric material.

In some approaches, the RF absorbing structure includes an adhesive layer disposed on a lower surface of the first dielectric layer, or on a lower surface of the first lower film of the resistive carbon material. The adhesive layer can be a pressure sensitive adhesive layer.

In some multilayer embodiments of the RF absorbing structure, the first dielectric layer is one of a plurality of dielectric layers; the first upper film is one of a plurality of upper films; the first adhesive layer is one of a plurality of adhesive layers; and the pluralities are arranged as a laminate structure with repeating layers of film, dielectric, and adhesive, in that order. In other multilayer embodiments of the RF absorbing structure, the first dielectric layer is one of a plurality of dielectric layers; the first upper film is one of a plurality of upper films; the first lower film is one of a plurality of lower films; the first adhesive layer is one of a plurality of adhesive layers; and the pluralities are arranged as a laminate structure with repeating layers of upper film, dielectric, lower film, and adhesive, in that order. The adhesive layers can include one or more pressure sensitive adhesive layers and/or one or more liquid adhesive layers.

In some approaches, an RF apparatus includes an RF absorbing structure such as the various structures described above. For example, the RF apparatus can include an RF cavity that is loaded with the RF absorbing structure to improve isolation of the RF cavity. As another example, the RF apparatus can include an antenna aperture and the RF absorbing structure can be arranged on or around the antenna aperture to improve performance characteristics of the antenna aperture such as sidelobe characteristics. As another example, the RF apparatus can include two or more antenna apertures and the RF absorbing structure can be arranged or disposed on a surface between pairs of the two or more antenna apertures to attenuate surface waves that might otherwise propagate along the surface between the pairs of the two or more antenna apertures. For example, the RF apparatus can be a RF repeater apparatus with one or more receive antennas and one or more transmit antennas, and the RF absorbing structure can be arranged or disposed to attenuate surface waves that might otherwise propagate from a transmit antenna to a receive antenna or vice versa, thus to improve front-to-back isolation of the RF repeater apparatus.

Some approaches provide a method of manufacture (e.g., of the various RF absorbing structures described above) that includes applying an upper film of a resistive carbon material and/or conductive material to an upper surface of a dielectric layer of a dielectric material. The method can further include applying a lower film of the resistive carbon material and/or conductive material to a lower surface of the dielectric layer. The dielectric material, the resistive carbon material, and the conductive material can be selected from the various materials described above.

In some approaches, the method of manufacture is a roll-to-roll process. For example, the roll-to-roll process can include unrolling a roll of the dielectric material to present the dielectric layer for the applying of the upper film; and rolling a second roll of the dielectric material with the applied upper film.

The applying of the upper film can include coating the upper surface of the dielectric layer with the resistive carbon material. For example, the coating of the upper surface can be a spray or roller coating of the upper surface. Alternatively, the coating of the upper surface can be an applying of the resistive carbon material with precut sponges. In some approaches, the coating of the upper surface can be a patterned or stenciled coating of the upper service, e.g., using a silkscreen or similar process. For approaches in which the lower surface is also coated, these same coating approaches are applicable for the lower surface.

As an alternative to the roll-to-roll process, the method of manufacture can be a printed circuit board (PCB) process, e.g., where the dielectric layer is an RF prepreg material and the resistive carbon material is applied using a PCB printing process.

In some approaches, the method of manufacture is a multilayer process. For example, one multilayer process includes cutting the dielectric layer with the applied upper film to provide a set of sheets or patches with a selected shape and then stacking the set of sheets or patches to provide a laminar RF absorbing structure, with an adhesive material (e.g., liquid adhesive or pressure-sensitive adhesive) between adjacent layers of the stack. Another multilayer process can be a multilayer roll-to-roll process, e.g., where multiple layers are unrolled and brought together in a multilayer structure.

With reference now to FIG. 1, an illustrative example of an RF absorbing structure is depicted. View 101 depicts a top view of the structure. In this non-limiting example, the structure has a rectangular shape with small diagonal cutouts at each corner of the rectangle. View 102 depicts a cross section of the structure, showing a dielectric layer 110 having an upper film 111 and a lower film 112, with an adhesive layer 113 below the lower film 112. As discussed above, the dielectric layer can be, for example, a plastic material such as polycarbonate, polyethylene, polyester, silicone, or RF prepreg. The dielectric layer can have a thickness of, for example, about 5, 10, or 20 mils, depending on the desired range of operating wavelengths for the RF application. In some approaches, the dielectric layer can have a thickness substantially less than an operating wavelength for the RF application. For example, the dielectric layer thickness can be less than about one-fifth of an operating wavelength, or less then about one-tenth of an operating wavelength. As a specific example, for an RF device that operates at 28 GHz, a dielectric layer thickness of 10 mils corresponds to about one fortieth of the 28 GHz wavelength. The upper film 111 and lower film 112 can be films of resistive carbon, or films that includes both resistive carbon and a conductive material such as copper, silver, or gold ink. As discussed above, the films can include patterns of the resistive carbon and/or the conductive material, e.g., as zigzags, lines, dots, circles, etc.

Figure 2:
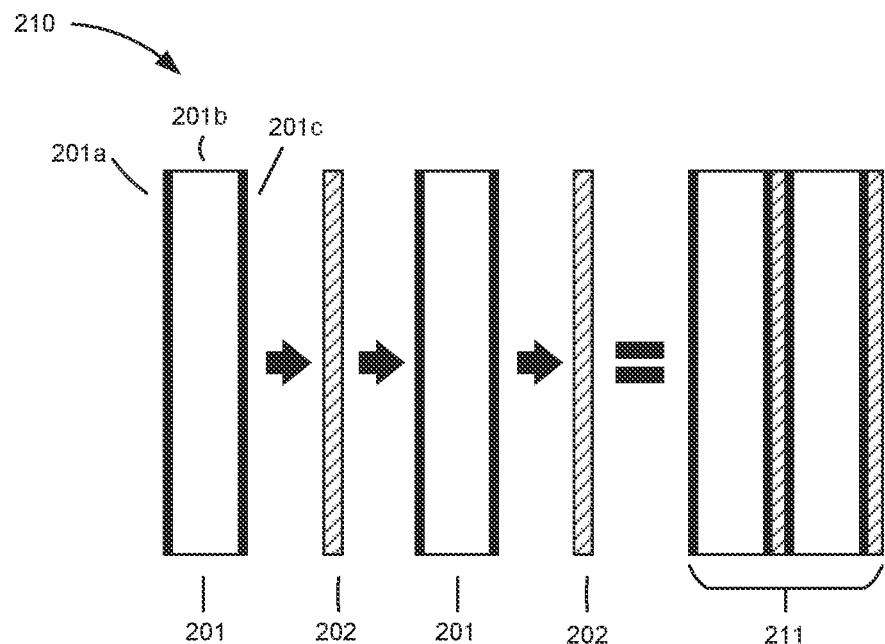
FIG. 2 depicts an example of a multilayer laminate using PSA between successive layers.
Figure 2:
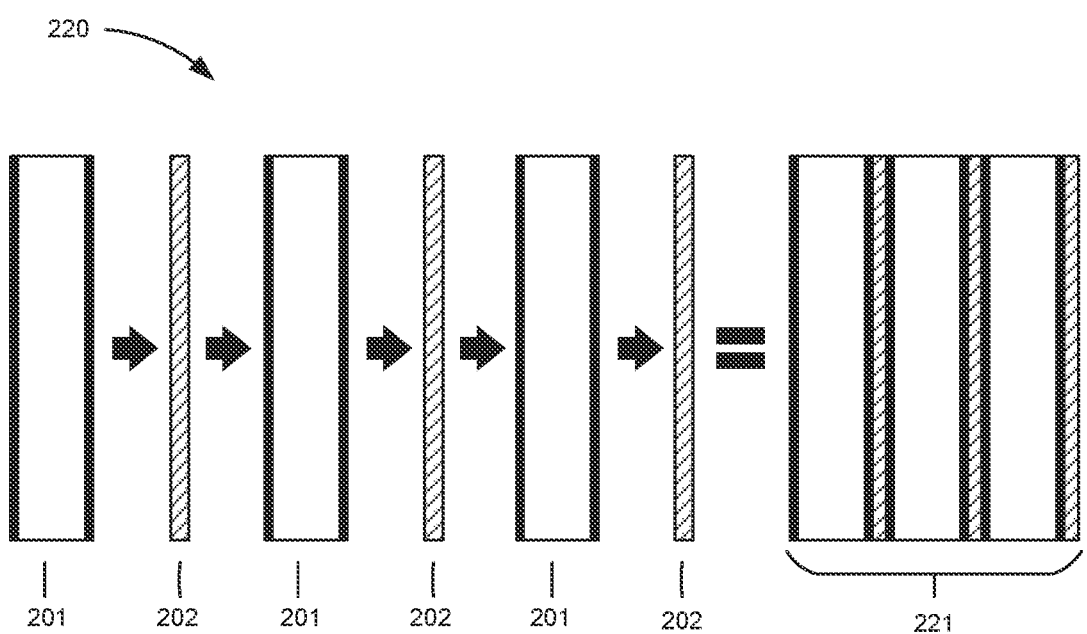

With reference now to FIG. 2, illustrative examples of multilayer laminates using PSA between successive layers are depicted. Configuration 210 depicts a two-stack configuration 211 wherein two layers 201, each having an upper film 201a, a dielectric layer 201b, and a lower film 201c, are joined together with a pressure sensitive adhesive 202. A second pressure sensitive adhesive layer is positioned at the bottom of the stack for adhesion to an RF device for a desired RF application. Configuration 220 depicts a three-stack configuration 221 wherein three layers 201, each having an upper film 201a, a dielectric layer 201b, and a lower film 201c, are joined together with a pressure sensitive adhesive 202. A third pressure sensitive layer is positioned at the bottom of the stack for adhesion to an RF device for a desired RF application. While each layer is depicted as having both upper and lower films 201a and 201b, in some applications, only one film is applied to each layer.

Figure 3:
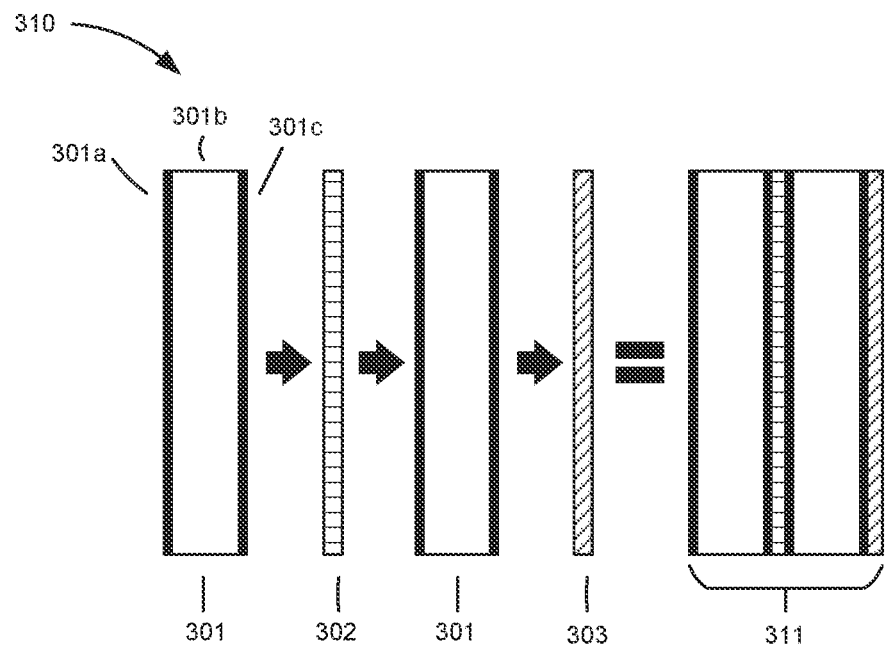
FIG. 3 depicts an example of a multilayer laminate using liquid adhesive between layers.
Figure 3:
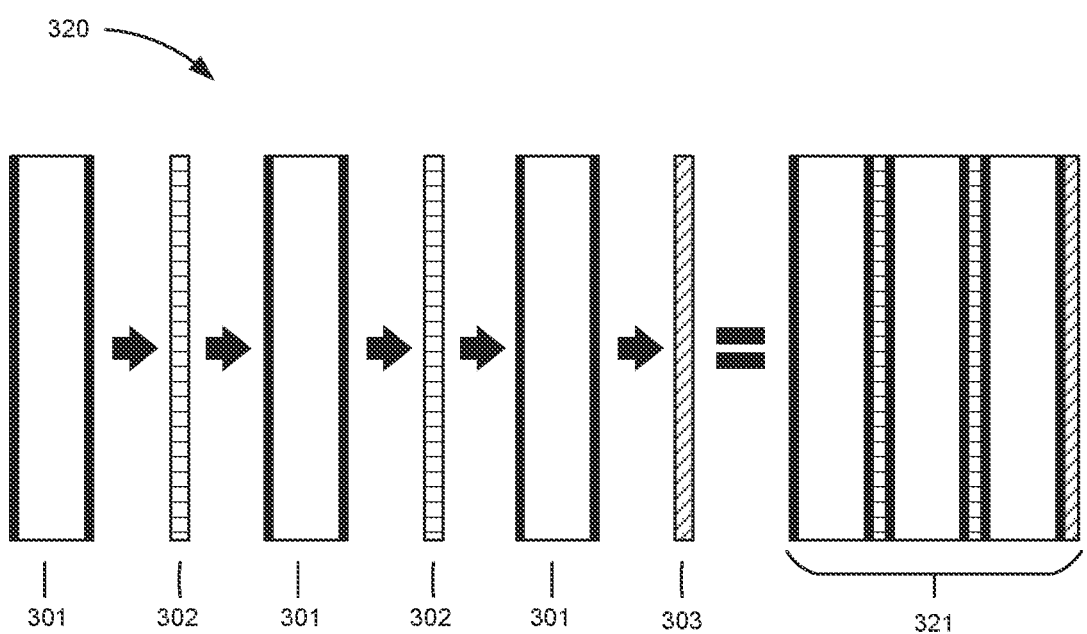

With reference now to FIG. 3, illustrative examples of multilayer laminates using liquid adhesive between successive layers are depicted. Configuration 310 depicts a two-stack configuration 311 wherein two layers 301, each having an upper film 301a, a dielectric layer 301b, and a lower film 301c, are joined together with a liquid adhesive 302. A pressure sensitive adhesive layer 303 is positioned at the bottom of the stack for adhesion to an RF device for a desired RF application. Configuration 320 depicts a three-stack configuration 321 wherein three layers 301, each having an upper film 301a, a dielectric layer 301b, and a lower film 301c, are joined together with a liquid adhesive 302. A pressure sensitive adhesive layer 303 is positioned at the bottom of the stack for adhesion to an RF device for a desired RF application. While each layer is depicted as having both upper and lower films 301a and 301b, in some applications, only one film is applied to each layer.

Figure 4:
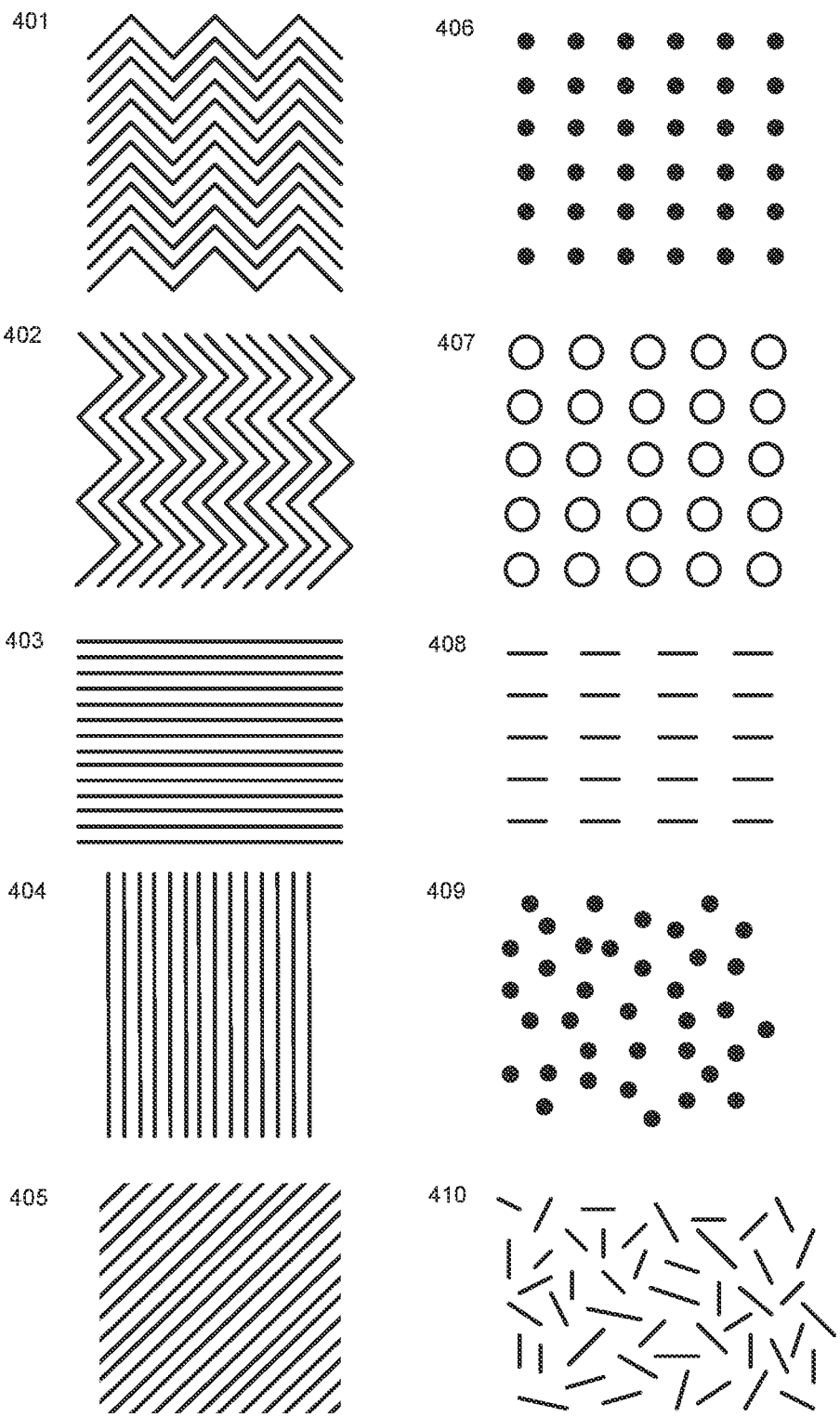
FIG. 4 depicts illustrative patterns for deposition of carbon ink.

With reference now to FIG. 4, illustrative examples for patterning of the resistive carbon material are depicted. While the resistive carbon material can be deposited in a solid layer, it can alternatively be deposited as, for example, a series of horizontal zigzags 401, a series of vertical zigzags 402, a series of horizontal lines 403, a series of vertical lines 404, a series of diagonal lines 405, an array of dots 406, an array of circles 407, an array of line segments 408, a random or pseudorandom arrangement of dots 409, or a random or pseudorandom arrangement of line segments 410. Feature sizes for these patterns can be substantially less than a wavelength corresponding to an intended frequency range for the RF absorbing structure. For example, feature sizes can be less than or equal to about one-fifth or one-tenth of a free-space wavelength corresponding to the intended frequency range. The particular pattern and/or feature size can be selected to enhance an impedance match between the RF absorbing structure and free space for the intended frequency range, to better channel RF energy into the RF absorbing structure for attenuation.

Figure 5:
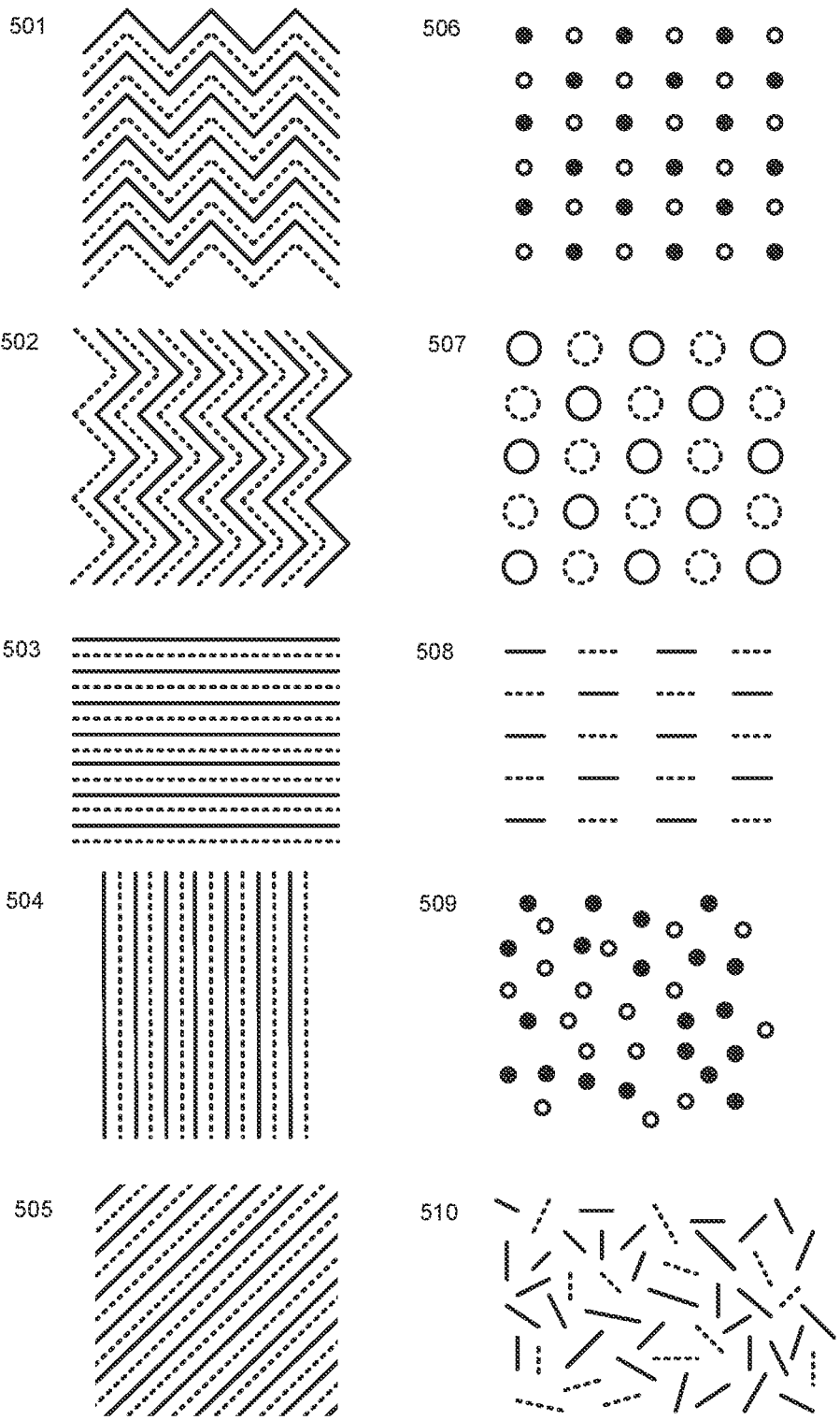
FIG. 5 depicts illustrative patterns for deposition of carbon ink interleaved or interspersed with depositions of a conductive material.

With reference now to FIG. 5, illustrative examples are depicted that interleave or intersperse patterns of resistive carbon material with patterns of a conductive material such as copper, silver, or gold ink. In 501, the resistive carbon material (solid lines) and the conductive material (dashed lines) are arranged as alternating horizontal zigzags. In 502, the resistive carbon material (solid lines) and the conductive material (dashed lines) are arranged as alternating vertical zigzags. In 503, the resistive carbon material (solid lines) and the conductive material (dashed lines) are arranged as alternating horizontal lines. In 504, the resistive carbon material (solid lines) and the conductive material (dashed lines) are arranged as alternating vertical lines. In 505, the resistive carbon material (solid lines) and the conductive material (dashed lines) are arranged as alternating diagonal lines. In 506, the resistive carbon material (solid dots) and the conductive material (hollow dots) are arranged in an alternating array of dots. In 507, the resistive carbon material (solid circles) and the conductive material (dashed circles) are arranged in an alternating array of circles. In 508, the resistive carbon material (solid line segments) and the conductive material (dashed line segments) are arranged in an alternating array of line segments. In 509, the resistive carbon material (solid dots) and the conductive material (hollow dots) are arranged in a random or pseudorandom arrangement of dots. In 510, the resistive carbon material (solid line segments) and the conductive material (dashed line segments) are arranged in a random or pseudorandom arrangement of line segments. While several of these illustrative examples depict alternating arrangements of the resistive carbon material and the conductive material, other arrangements are contemplated, e.g., having multiple resistive carbon material features interspersed with an occasional conductive material feature, or vice versa.

What is claimed as new and desired to be protected by Letters Patent of the United States is:

1. An RF absorbing structure, comprising:
a first dielectric layer of a dielectric material;
a first upper film that includes a resistive carbon material disposed on an upper surface of the first dielectric layer; and
a first lower film of the resistive carbon material disposed on a lower surface of the first dielectric layer.

2. The structure of claim 1, wherein the first upper film further includes a conductive material.

3. The structure of claim 1, wherein the first upper film is arranged in a first pattern.

4. The structure of claim 3, wherein the RF absorbing structure has a selected frequency range for RF absorption, and the first pattern is a periodic pattern having a feature size substantially less than a free-space wavelength corresponding to the selected frequency range.

5. The structure of claim 3, wherein the RF absorbing structure has a selected frequency range for RF absorption, and the first pattern is a random or pseudorandom pattern having a feature size substantially less than a free-space wavelength corresponding to the selected frequency range.

6. The structure of claim 1, wherein the first lower film is arranged in a second pattern.

7. The structure of claim 6, wherein the RF absorbing structure has a selected frequency range for RF absorption, and the second pattern is a periodic pattern having a feature size substantially less than a free-space wavelength corresponding to the selected frequency range.

8. The structure of claim 6, wherein the RF absorbing structure has a selected frequency range for RF absorption, and the second pattern is a random or pseudorandom pattern having a feature size substantially less than a free-space wavelength corresponding to the selected frequency range.

9. The structure of claim 1, further comprising:
a first adhesive layer disposed on a lower surface of the first lower film.

10. The structure of claim 9, wherein:
the first dielectric layer is one of a plurality of dielectric layers;
the first upper film is one of a plurality of upper films;
the first lower film is one of a plurality of lower films;
the first adhesive layer is one of a plurality of adhesive layers; and
the pluralities are arranged as a laminate structure with repeating layers of upper film, dielectric, lower film, and adhesive, in that order.

11. An RF absorbing structure, comprising:
a first dielectric layer of a dielectric material;
a first upper film that includes a resistive carbon material disposed on an upper surface of the first dielectric layer; and
a first adhesive layer disposed on a lower surface of the first dielectric layer.

12. The structure of claim 11, wherein:
the first dielectric layer is one of a plurality of dielectric layers;
the first upper film is one of a plurality of upper films;
the first adhesive layer is one of a plurality of adhesive layers; and
the pluralities are arranged as a laminate structure with repeating layers of film, dielectric, and adhesive, in that order.

13. An apparatus, comprising:
a first RF antenna aperture;
a second RF antenna aperture; and
an RF absorbing structure disposed on a surface between the first RF antenna aperture and the second RF antenna aperture, wherein the RF absorbing structure comprises a first dielectric layer of a dielectric material and a first upper film that includes a resistive carbon material disposed on an upper surface of the first dielectric layer.

14. The apparatus of claim 13, wherein the RF absorbing structure is arranged to at least partially improve sidelobe characteristics of the first RF antenna aperture or the second RF antenna aperture.

15. The apparatus of claim 13, wherein the RF absorbing structure is arranged to at least partially improve RF isolation between the first RF antenna aperture and the second RF antenna aperture.

16. A method, comprising:
applying an upper film of a resistive carbon material to an upper surface of a dielectric layer of a dielectric material; and
cutting the dielectric layer with the applied upper film to provide a set of sheets or patches with a selected shape.

17. The method of claim 16, wherein the first upper film includes a conductive material.

18. The method of claim 16, further comprising:
applying a lower film of the resistive carbon material to a lower surface of the dielectric layer.

19. The method of claim 18, further comprising:
applying an adhesive layer to a lower surface of the lower film.

20. The method of claim 16, wherein the dielectric material is a plastic material.

21. The method of claim 20, wherein the method is a roll-to-roll process.

22. The method of claim 21, wherein the roll-to-roll process includes:
unrolling a roll of the dielectric material to present the dielectric layer for the applying of the upper film; and
rolling a second roll of the dielectric material with the applied upper film.

23. The method of claim 22, wherein the applying of the upper film includes:
coating the upper surface of the dielectric layer with the resistive carbon material.

24. The method of claim 16, further comprising:
applying an adhesive layer to a lower surface of the dielectric layer.

25. The method of claim 16, further comprising:
stacking the set of sheets or patches to provide a laminar RF absorbing structure.

* * * * *